(12) United States Patent
Morimoto et al.

(10) Patent No.: US 9,869,891 B2
(45) Date of Patent: Jan. 16, 2018

(54) LIQUID CRYSTAL DISPLAY DEVICE AND METHOD OF MANUFACTURING THE SAME

(71) Applicant: Japan Display Inc., Tokyo (JP)

(72) Inventors: Masateru Morimoto, Tokyo (JP); Takeshi Sato, Tokyo (JP); Kimitoshi Ougiichi, Tokyo (JP)

(73) Assignee: Japan Display Inc., Tokyo (JP)

( * ) Notice: Subject to any disclaimer, the term of this patent is extended or adjusted under 35 U.S.C. 154(b) by 88 days.

(21) Appl. No.: 14/800,056

(22) Filed: Jul. 15, 2015

(65) Prior Publication Data

US 2015/0316805 A1    Nov. 5, 2015

Related U.S. Application Data

(63) Continuation of application No. 14/095,008, filed on Dec. 3, 2013, now Pat. No. 9,116,371.

(30) Foreign Application Priority Data

Dec. 10, 2012   (JP) .................................. 2012-269084

(51) Int. Cl.
*G02F 1/1345* (2006.01)
*G02F 1/133* (2006.01)
(Continued)

(52) U.S. Cl.
CPC ........ *G02F 1/13306* (2013.01); *G02F 1/1339* (2013.01); *G02F 1/1368* (2013.01); *G02F 1/13454* (2013.01); *G02F 1/136227* (2013.01); *H01L 27/1248* (2013.01); *G02F 2001/133388* (2013.01)

(58) Field of Classification Search
None
See application file for complete search history.

(56) References Cited

U.S. PATENT DOCUMENTS

| 2006/0049404 | A1 | 3/2006 | Park et al. |
| 2010/0163879 | A1 | 7/2010 | Jung et al. |
| 2011/0204367 | A1 | 8/2011 | Nakatani et al. |

FOREIGN PATENT DOCUMENTS

| CN | 101196635 A | 6/2008 |
| JP | 2006-80472 A | 3/2006 |

OTHER PUBLICATIONS

Chinese Office Action dated Dec. 21, 2015, for corresponding CN application No. 201310665079.5.

*Primary Examiner* — Richard Kim
(74) *Attorney, Agent, or Firm* — Typha IP LLC

(57) ABSTRACT

A thin-film transistor includes a gate electrode made of metal, a light transmissive gate insulating film that covers the gate electrode, a semiconductor film that overlaps with the gate electrode through the gate insulating film, and a source electrode and a drain electrode, made of metal, and spaced from each other. The gate electrode and the semiconductor film have respective through-holes communicated with each other so that the gate insulating film enters an inside of the through-holes. The gate insulating film has an area of the inside of the through-holes of the gate electrode and the semiconductor film. The source electrode and the drain electrode pass through the inside of the through-holes of the gate electrode and the semiconductor film so as to overlap with a part of the area of the inside of the through-hole of the gate insulating film and avoid a remaining portion thereof.

7 Claims, 22 Drawing Sheets

(51) Int. Cl.
G02F 1/1362 (2006.01)
G02F 1/1368 (2006.01)
G02F 1/1339 (2006.01)
H01L 27/12 (2006.01)
*G02F 1/1333* (2006.01)

LIQUID CRYSTAL DISPLAY DEVICE AND METHOD OF MANUFACTURING THE SAME

CROSS REFERENCE TO RELATED APPLICATION

This application is a continuation of U.S. patent application Ser. No. 14/095,008, filed on Dec. 3, 2013, which claims priority from Japanese patent application No. 2012-269084 filed on Dec. 10, 2012, the entire contents of which are incorporated herein by reference.

BACKGROUND OF THE INVENTION

1. Field of the Invention

The present invention relates to a liquid crystal display device and a method of manufacturing the liquid crystal display device.

2. Description of the Related Art

As display devices of information communication terminals such as computers, and television receivers, liquid crystal display devices have been widely used. The liquid crystal display device is designed to change an orientation of a liquid crystal composition confined between two glass substrates by changing an electric field, and control the degree of transmission of a light that passes through the two glass substrates and the liquid crystal composition to display an image.

In the liquid crystal display device, a driver circuit for applying a voltage corresponding to a given gradation value to respective pixels of a screen needs to be arranged on a glass substrate or a circuit substrate connected to the glass substrate. There has been known the driver circuit that is incorporated into an IC (integrated circuit) chip, and placed on the glass substrate. In recent years, since it is desirable to narrow an area (hereinafter referred to as frame area) outside of a display area on the glass substrate, thin film transistors may be formed in the frame area without placing an IC chip thereon, and the driver circuit may be arranged directly on the glass substrate without using the IC chip.

JP 2006-080472 A discloses a structure in which a parasitic capacitance is reduced in amorphous silicon thin film transistors arranged in the frame area.

SUMMARY OF THE INVENTION

The frame area is provided with a sealing material for sealing a liquid crystal material. If the frame area is narrowed, the sealing material overlaps with the thin film transistors. The sealing material includes a light curing resin, but because a light shielding film configuring a black matrix is formed on a counter substrate, a light has to be applied from an outside of the substrate on which the thin film transistors are formed. For that reason, the light is blocked by gate electrodes configuring the thin film transistors or the like, and the resin is not sufficiently cured. Therefore, a sealing property may be degraded.

The present invention aims at sealing the liquid crystal material with a high sealing property.

(1) According to the present invention, there is provided a liquid crystal display device including: a first substrate including a pixel area which displays an image, and a peripheral area which is disposed outside of the pixel area; a driver circuit including thin film transistors and formed in the peripheral area of the first substrate; a second substrate arranged to face the first substrate; and a sealing material disposed to surround the pixel area in the peripheral area of the first substrate, including a light curing resin, and bonding the first substrate and the second substrate together, in which a part of the sealing material overlaps with at least a part of the thin film transistors, each of the thin film transistors includes a gate electrode, a gate insulating film that covers the gate electrode, a semiconductor film that overlaps with the gate electrode through the gate insulating film, and a source electrode and a drain electrode formed on the semiconductor film on a side opposite to the gate insulating film, and spaced from each other, the gate electrode has a first through-hole, an inside of the first through-hole is filled with the gate insulating film, and the semiconductor film has a second through-hole that overlaps with the first through-hole. According to the present invention, the sealing material overlaps with the thin film transistors, but since a light can be applied from the first substrate through the through-holes of the gate electrodes and the semiconductor films, the sealing material can be sufficiently cured, and the liquid crystal material can be sealed with a high sealing property.

(2) In the liquid crystal display device according to the item (1), a part of the sealing material may overlap with the first through-hole and the second through-hole.

(3) The liquid crystal display device according to the item (1) may further include a passivation film having at least one layer that covers the source electrode and the drain electrode.

(4) In the liquid crystal display device according to the item (3), the passivation film may include at least one depressed portion, and the depressed portion may overlap with the first through-hole and the second through-hole.

(5) In the liquid crystal display device according to the item (3), the passivation film may include at least one projecting portion, and the projecting portion may overlap with the first through-hole and the second through-hole.

(6) In the liquid crystal display device according to the item (1), the second through-hole may be larger than the first through-hole.

(7) In the liquid crystal display device according to the item (1), at least one of the source electrode and the drain electrode may overlap with the first through-hole and the second through-hole.

(8) In the liquid crystal display device according to the item (1), the source electrode and the drain electrode may not overlap with the first through-hole and the second through-hole.

(9) In the liquid crystal display device according to the item (1), the semiconductor film may include a portion configuring a channel area of each thin film transistor between the source electrode and the drain electrode, and the source electrode and the drain electrode may be configured so that the channel area snakes.

(10) In the liquid crystal display device according to the item (1), each of the source electrode and the drain electrode may be formed into a pectinate shape having a plurality of branched portions, and one of the branched portions of the source electrode and one of the branched portions of the drain electrode may be alternately arranged.

(11) According to the present invention, there is provided a liquid crystal display device manufacturing method including: bonding a first substrate including a pixel area which displays an image, and a peripheral area which is disposed outside of the pixel area, on which a driver circuit including thin film transistors formed in the peripheral area is formed, and a second substrate together with a sealing material containing a light curing resin; and irradiating the sealing material with ultraviolet rays, in which a part of the sealing material overlaps with at least a part of the thin film transistors, each of the thin film transistors includes a gate electrode, a gate insulating film that covers the gate electrode, a semiconductor film that overlaps the gate electrode through the gate insulating film, and a source electrode and a drain electrode formed on the semiconductor film on a side opposite to the gate insulating film, and spaced from each other, the gate electrode has a first through-hole, an inside of the first through-hole is filled with the gate insulating film, the semiconductor film has a second through-hole that overlaps with the first through-hole, and the ultraviolet rays are applied from an outside of the first substrate toward the sealing material so as to pass through the first through-hole and the second through-hole. According to the present invention, the sealing material overlaps with the thin film transistors, but since the light can be applied from the first substrate through the through-holes of the gate electrodes and the semiconductor films, the sealing material can be sufficiently cured, and the liquid crystal material can be sealed with a high sealing property.

(12) In the liquid crystal display device manufacturing method according to the item (11), a part of the sealing material may overlap with the first through-hole and the second through-hole.

(13) The liquid crystal display device manufacturing method according to the item (11) may further include forming a passivation film having at least one layer that covers the source electrode and the drain electrode.

(14) The liquid crystal display device manufacturing method according to the item (13) may further include forming at least one depressed portion in the passivation film, and the depressed portion may overlap with the first through-hole and the second through-hole.

(15) The liquid crystal display device manufacturing method according to the item (13) may further include forming at least one projecting portion in the passivation film, and the projecting portion may overlap with the first through-hole and the second through-hole.

(16) In the liquid crystal display device manufacturing method according to the item (11), the second through-hole may be larger than the first through-hole.

(17) In the liquid crystal display device manufacturing method according to the item (11), at least one of the source electrode and the drain electrode may overlap with the first through-hole and the second through-hole.

(18) In the liquid crystal display device manufacturing method according to the item (11), the source electrode and the drain electrode may not overlap with the first through-hole and the second through-hole.

(19) In the liquid crystal display device manufacturing method according to the item (11), the semiconductor film may include a portion configuring a channel area of each thin film transistor between the source electrode and the drain electrode, and the source electrode and the drain electrode maybe configured so that the channel area snakes.

(20) In the liquid crystal display device manufacturing method according to the item (11), each of the source electrode and the drain electrode maybe formed into a pectinate shape having a plurality of branched portions, and one of the branched portions of the source electrode and one of the branched portions of the drain electrode may be alternately arranged.

DETAILED DESCRIPTION OF THE INVENTION

Figure 1:
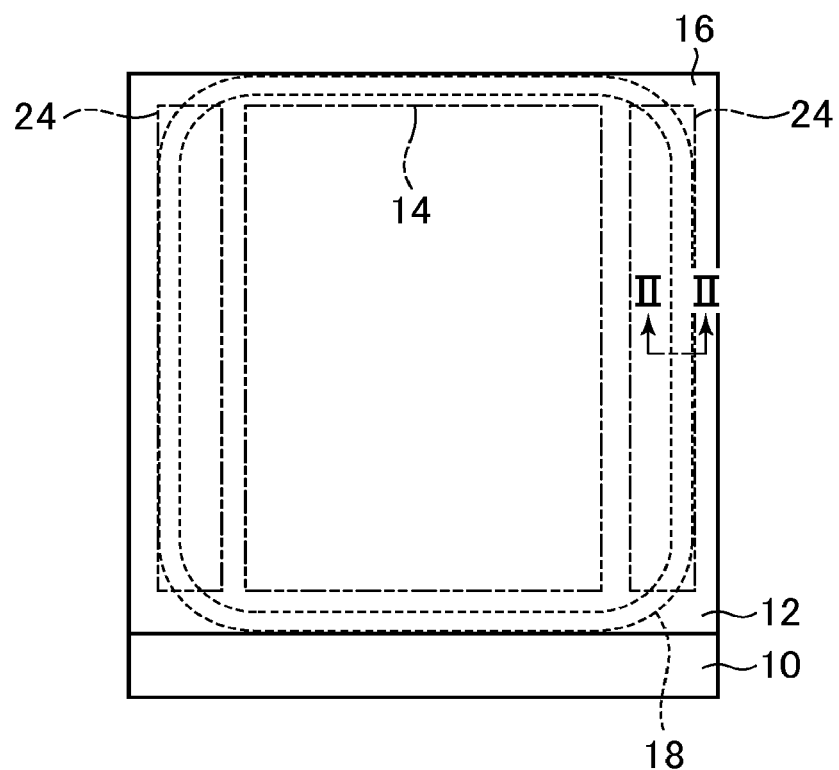
FIG. 1 is a plan view illustrating a liquid crystal display device according to a first embodiment of the present invention.
Figure 2:
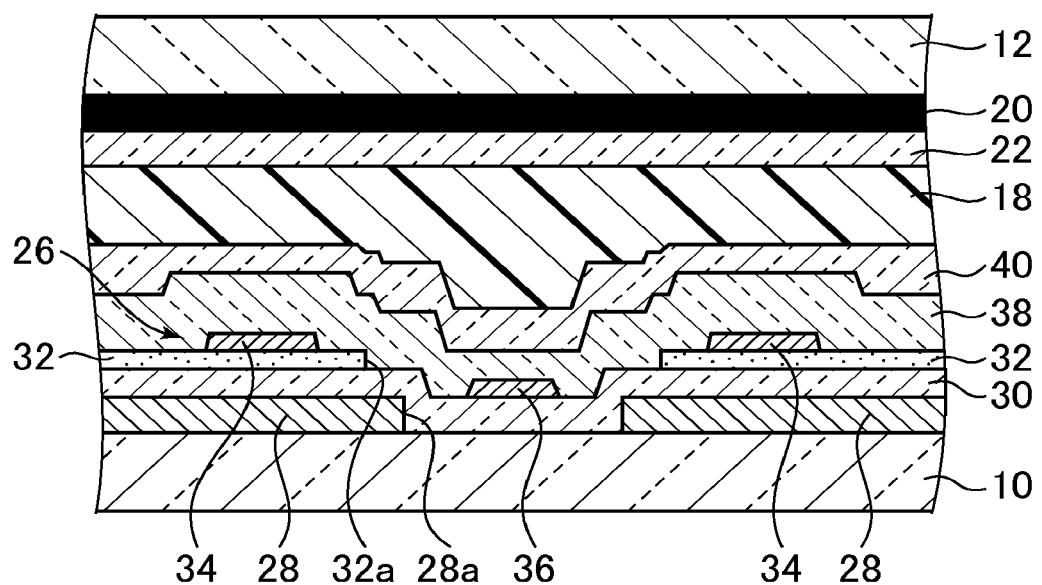
FIG. 2 is a cross-sectional view of the liquid crystal display device illustrated in FIG. 1 taken along a line II-II.

Hereinafter, embodiments of the present invention will be described with reference to the accompanying drawings.
First Embodiment FIG. 1 is a plan view illustrating a liquid crystal display device according to a first embodiment of the present invention. FIG. 2 is a cross-sectional view of the liquid crystal display device illustrated in FIG. 1 taken along a line II-II.

The liquid crystal display device includes a first substrate 10 and a second substrate 12 which are made of a light transmissive material such as glass. The second substrate 12 is arranged to face the first substrate 10 with a cell gap therebetween. A liquid crystal material not shown is arranged between the first substrate 10 and the second substrate 12 (between oriented films not shown in detail). A liquid crystal material is driven for each of pixels to display an image. The first substrate 10 includes a pixel area 14 in which a plurality of pixel electrodes (not shown) for displaying the image are formed. The first substrate 10 includes a peripheral area 16 (or frame area) outside of the pixel area 14.

The first substrate 10 and the second substrate 12 are bonded together by a sealing material 18 with a cell gap therebetween. The sealing material 18 includes a light curing resin that is changed from a liquid form into a solid by action of a light energy such as ultraviolet rays. The sealing material 18 is located in the peripheral area 16 of the first substrate 10, and provided to surround the pixel area 14.

The second substrate 12 is formed of a color filter substrate, and includes a colored layer not shown and a black matrix. In the pixel area 14, a light shielding layer 20 configuring a black matrix is designed to cover the peripheral area 16 of the first substrate 10 as illustrated in FIG. 2. FIG. 2 illustrates an overcoat layer 22 that covers the light shielding layer 20. An oriented film that contacts with a liquid crystal material not shown may reach the peripheral area 16.

The peripheral area 16 of the first substrate 10 is formed with a driver circuit 24 (for example, a scanning circuit) for driving a liquid crystal material not shown. The driver circuit 24 includes thin film transistors 26. The first substrate 10 formed with the thin film transistors 26 is called TFT (thin film transistor) substrate. The sealing material 18 overlaps with the thin film transistors 26.

Figure 3:
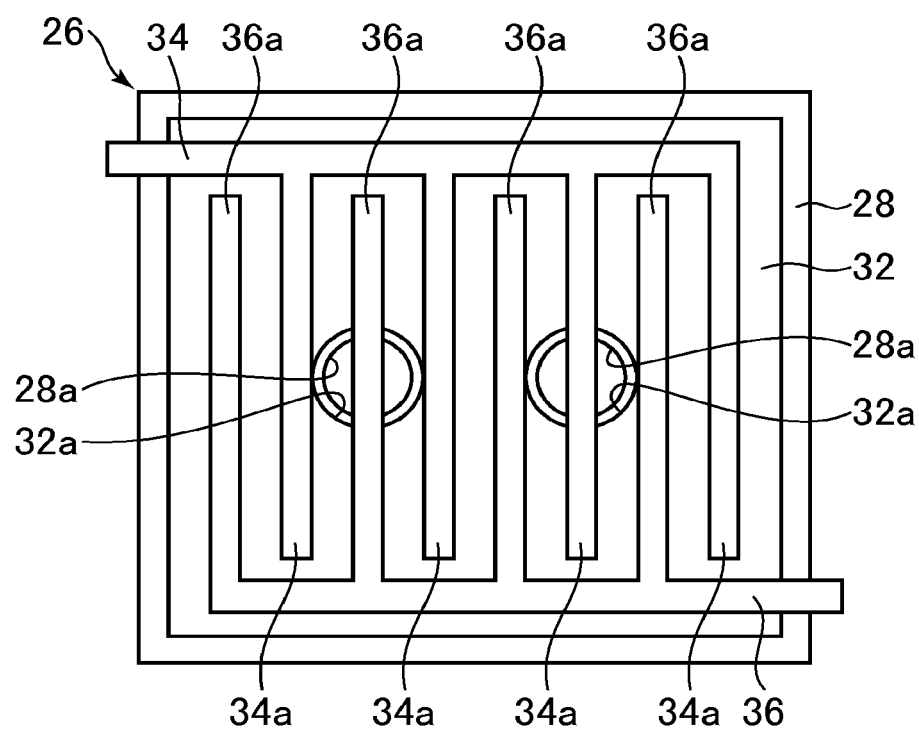
FIG. 3 is a plan view illustrating a thin film transistor illustrated in FIG. 2.

FIG. 3 is a plan view of each thin film transistor 26 illustrated in FIG. 2. The thin film transistor 26 includes a gate electrode 28 made of metal. The thin film transistor 26 illustrated in FIG. 2 is of a bottom gate type, but not limited to this type. The gate electrode 28 is made of elements selected from a group of aluminum, molybdenum, chrome, copper, tungsten, titanium, zirconium, tantalum, silver, and manganese, or alloy combining those elements together. Also, a laminated structure in which aluminum is laminated on titanium, or an upper layer and a lower layer of aluminum are sandwiched between titanium may be applied. The gate electrode 28 is made of metal selected as a material having a light shielding property, and has a thickness of the degree that shields the light for ensuring the electric conductivity.

Each of the thin film transistors 26 includes a gate insulating film 30 that covers the gate electrode 28. The gate insulating film 30 can be formed of an insulating film such as a silicon oxide film, a silicon nitride film or a silicon oxynitride film, or may be of a structure in which those insulating films are laminated. The gate insulating film 30 has a light transmissive property.

The thin film transistor 26 includes a semiconductor film 32 that overlaps with the gate electrode 28 through the gate insulating film 30. The semiconductor film 32 is disposed on the gate insulating film 30. The semiconductor film 32 is made of semiconductor such as amorphous silicon or polysilicon, or oxide semiconductor.

The gate electrode 28 and the semiconductor film 32 have through-holes 28a and 32a that are communicated with each other, respectively. A planar shape of the through-holes 28a and 32a is circular. The through-hole 32a of the semiconductor film 32 is larger than the through-hole 28a of the gate electrode 28 so that the semiconductor film 32 is not exposed to an inside of the through-hole 28a of the gate electrode 28. As illustrated in FIG. 2, the gate insulating film 30 enters the inside of the through-holes 28a and 32a of the gate electrode 28 and the semiconductor film 32. In detail, the gate insulating film 30 placed on the gate electrode 28 enters the through-hole 28a of the gate electrode 28 to form a depressed portion, and the through-hole 32a of the semiconductor film 32 is located around the depressed portion, and on the gate insulating film 30. The gate insulating film 30 has an area of the inside of the through-holes 28a and 32a of the gate electrode 28 and the semiconductor film 32 (area entering the through-hole 28a of the gate insulating film 30).

The thin film transistor 26 includes a source electrode 34 and a drain electrode 36. As illustrated in FIG. 3, the source electrode 34 and the drain electrode 36 are formed into a pectinate shape including a plurality of branched portions 34a and 36a, respectively. One of the branched portions 34a of the source electrode 34 and one of the branched portions 36a of the drain electrode 36 are alternately arranged.

The semiconductor film 32 includes a portion configuring a channel area of the thin film transistors 26 between the source electrode 34 and the drain electrode 36. The channel area is shaped to snake between the source electrode 34 and the drain electrode 36. The channel area is so snaked as to lengthen a channel length without lengthening in one direction. That is, higher integration of the thin film transistors 26 can be performed.

The source electrode 34 and the drain electrode 36 are formed on the semiconductor film 32 on a side opposite to the gate insulating film 30, and spaced from each other. The source electrode 34 and the drain electrode 36 come in contact with a source area and a drain area of the semiconductor film 32, respectively. The source electrode 34 and the drain electrode 36 are each made of metal. The source electrode 34 and the drain electrode 36 are each made of a material selectable as the above-mentioned gate electrode 28, and may be made of the same material as that of the gate electrode 28. The source electrode 34 and the drain electrode 36 are made of metal selected as a material having the light shielding property, and have a thickness of the degree that shields the light for ensuring the electric conductivity.

At least one of the source electrode 34 and the drain electrode 36 passes through the inside of the through-holes 28a and 32a of the gate electrode 28 and the semiconductor film 32. In the example of FIG. 3, a plurality of through-holes 28a are formed in the gate electrode 28, a plurality of through-holes 32a are formed in the semiconductor film 32, and one of the through-holes 28a of the gate electrode 28 and one of the through-holes 32a of the semiconductor film 32 are communicated with each other. A part (for example, branched portion 34a) of the source electrode 34 passes through the insides of one through-hole 28a and one through-hole 32a which are communicated with each other. Also, a part (for example, branched portion 36a) of the drain electrode 36 passes through the insides of one through-hole 28a and one through-hole 32a which are communicated with each other.

The source electrode 34 and the drain electrode 36 that pass through the insides of the through-holes 28a and 32a are arranged so as not to block the through-holes 28a and 32a. Also, the source electrode 34 and the drain electrode 36 that pass through the insides of the through-holes 28a and 32a overlap with a part of the gate insulating film 30 inside the through-holes 28a and 32a, but avoids the overlapping of the remaining portion. Therefore, a light passes through the through-holes 28a and 32a that penetrate through the gate electrode 28 and the semiconductor film 32.

The source electrode 34 and the drain electrode 36 are covered by passivation films 38 and 40 of one layer or a plurality of layers (two layers in FIG. 2). The passivation films 38 and 40 may be formed of an insulating film such as a silicon oxide film, a silicon nitride film or a silicon oxynitride film, or may be formed by laminating those insulating films. The passivation films 38 and 40 have the light transmissive property. The sealing material 18 is disposed on the passivation films 38 and 40.

Figure 4:
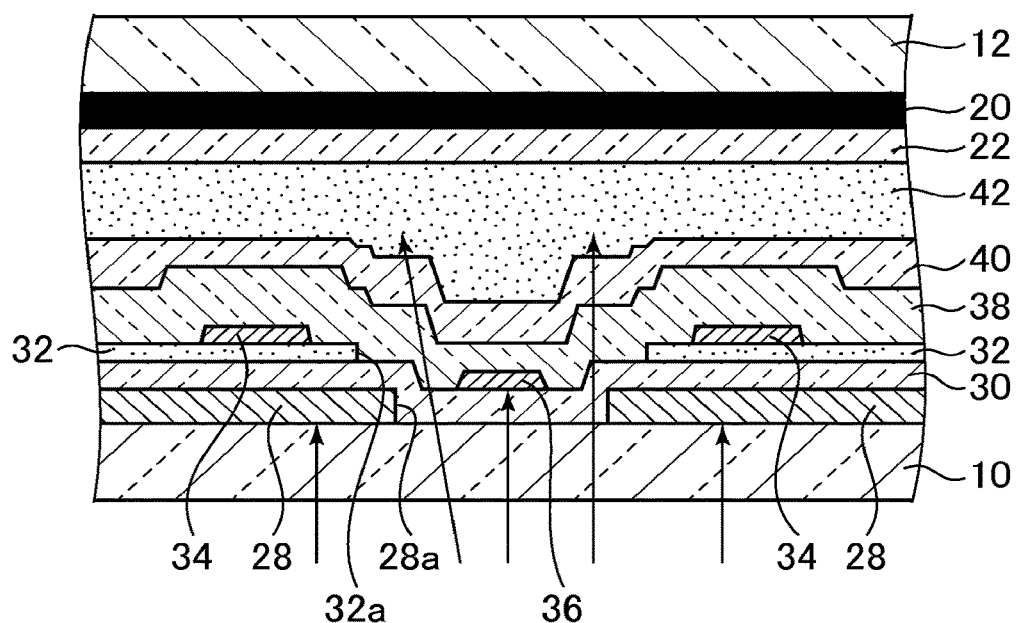
FIG. 4 is a diagram illustrating a method of manufacturing the liquid crystal display device according to this embodiment.

FIG. 4 is a diagram illustrating a method of manufacturing the liquid crystal display device according to this embodiment. In this embodiment, the first substrate 10 and the second substrate 12 are bonded together by a sealing material 42 made of a light curing resin with a cell gap therebetween. The sealing material 42 containing the light curing resin therein is disposed to overlap with the thin film transistors 26 around the pixel area 14 in the peripheral area 16 of the first substrate 10 (refer to FIG. 1) so that the sealing material 18 (refer to FIG. 2) is configured.

The sealing material 42 containing the light curing resin therein is irradiated with ultraviolet rays to form the sealing material 18 (refer to FIG. 2). In this embodiment, since the light shielding layer 20 extended from the black matrix is formed on the second substrate 12 side, the ultraviolet rays cannot be applied from the outside of the second substrate 12. Under the circumstances, the ultraviolet rays are applied from the outside of the first substrate 10. In this situation, as described above, the through-holes 28a and 32a of the gate electrode 28 and the semiconductor film 32 are formed so that the ultraviolet rays can be applied to pass through the through-holes 28a and 32a.

According to this embodiment, the sealing material 18 overlaps with the thin film transistors 26, but since the light can be applied from the first substrate 10 through the through-holes 28a and 32a of the gate electrodes 28 and the semiconductor films 32, the sealing material can be sufficiently cured, and the liquid crystal material can be sealed with a high sealing property.

Figure 5:
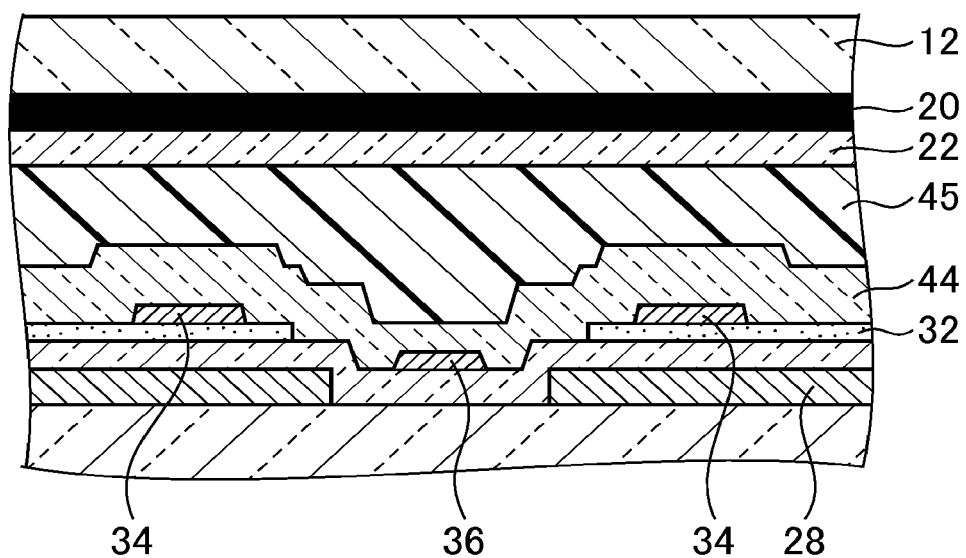
FIG. 5 is a cross-sectional view illustrating a first modified example of the liquid crystal display device according to the first embodiment of the present invention.

FIG. 5 is a cross-sectional view illustrating a first modified example of the liquid crystal display device according to the first embodiment of the present invention. This example is different from the above embodiment in that a passivation film 44 of one layer is formed to cover the source electrode 34 and the drain electrode 36, and a sealing material 45 is formed on the passivation film 44.

Figure 6:
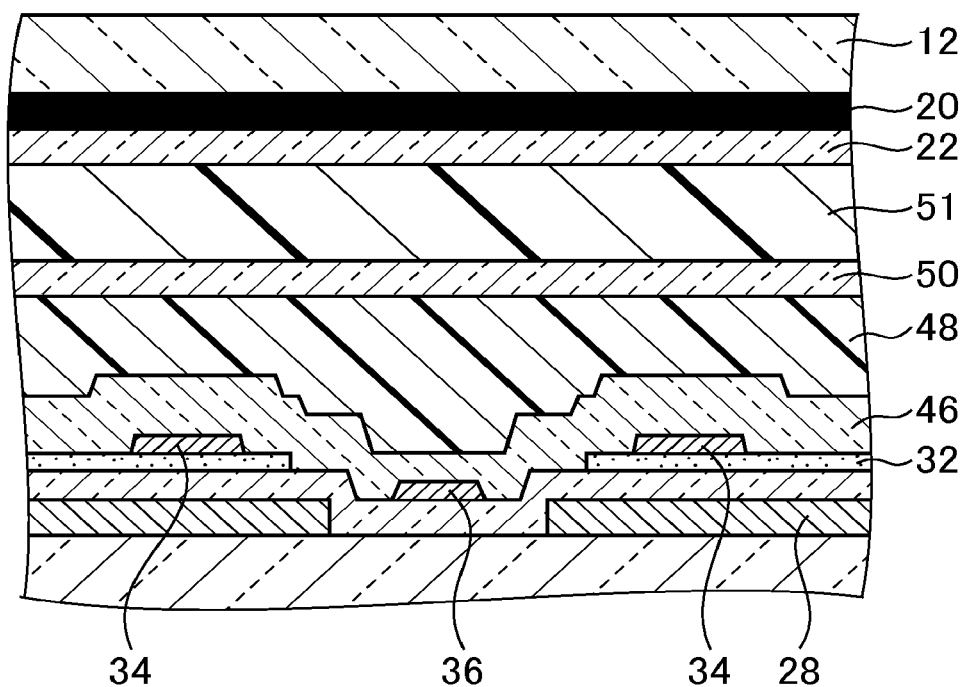
FIG. 6 is a cross-sectional view illustrating a second modified example of the liquid crystal display device according to the first embodiment of the present invention.

FIG. 6 is a cross-sectional view illustrating a second modified example of the liquid crystal display device according to the first embodiment of the present invention. In this example, a passivation film 48 of at least one layer made of an organic material is formed on a passivation film 46 made of inorganic material which covers the source electrode 34 and the drain electrode 36. Further, a passivation film 50 made of an inorganic material is formed on the passivation film 48 made of organic material. A sealing material 51 is formed on the passivation film 50.

Figure 7:
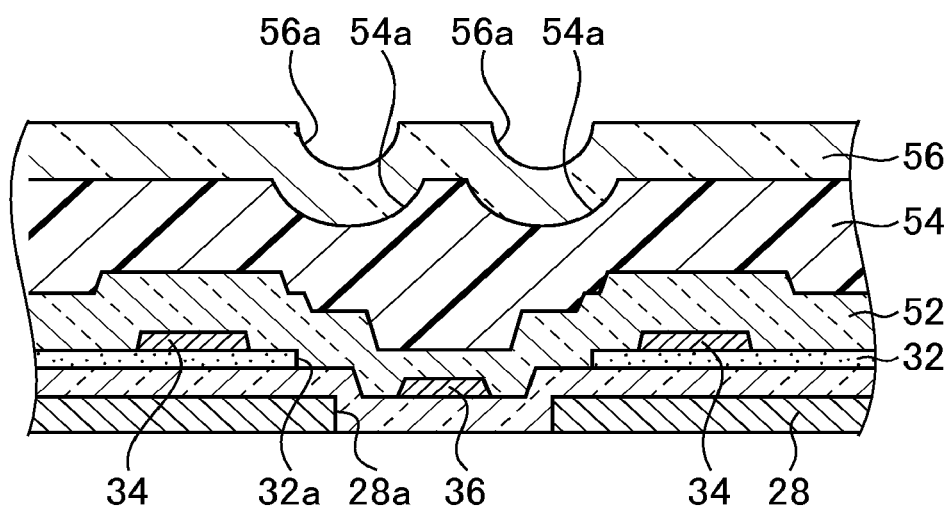
FIG. 7 is a diagram illustrating a structure of an upper portion of a first substrate used in a third modified example of the liquid crystal display device according to the first embodiment of the present invention.

FIG. 7 is a diagram illustrating a structure of an upper portion of a first substrate used in a third modified example of the liquid crystal display device according to the first embodiment of the present invention. In this example, a passivation film 54 of at least one layer which is made of an organic material is formed on a passivation film 52 made of an inorganic material which covers the source electrode 34 and the drain electrode 36. Depressed portions 54a are formed on a surface of the passivation film 54 made of an organic material above the through-holes 28a and 32a of the gate electrode 28 and the semiconductor film 32. A plurality of the depressed portions 54a are formed above one set of the through-holes 28a and 32a.

Also, a passivation film 56 made of an inorganic material is formed on the passivation film 54 made of an organic material. Also, depressed portions 56a are formed on a surface of the passivation film 56 made of an inorganic material above the through-holes 28a and 32a of the gate electrode 28 and the semiconductor film 32. A plurality of the depressed portions 56a are formed above one set of the through-holes 28a and 32a.

According to the above configuration, the light that has passed through the insides of the through-holes 28a and 32a is refracted by the depressed portions 54a and 56a, thereby being capable of improving an irradiation efficiency of the light to the light curing resin.

Figure 8:
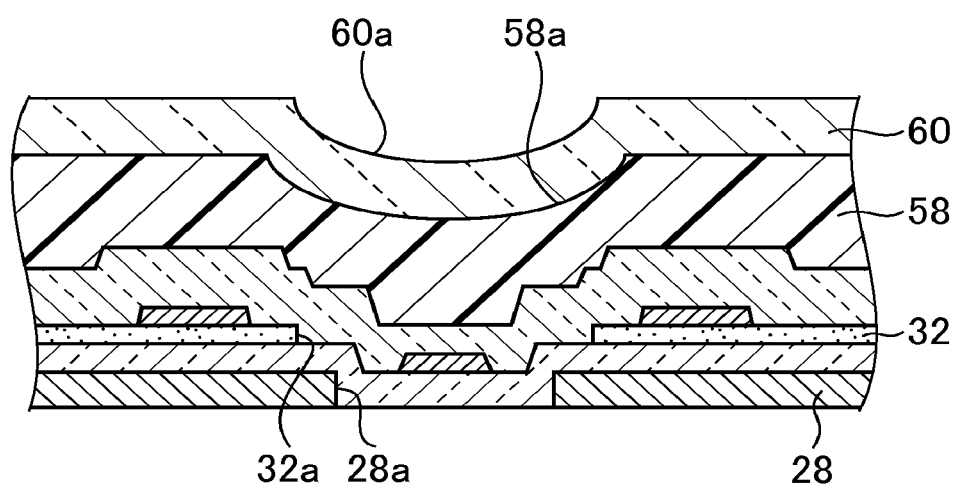
FIG. 8 is a diagram illustrating a structure of an upper portion of a first substrate used in a fourth modified example of the liquid crystal display device according to the first embodiment of the present invention.

FIG. 8 is a diagram illustrating a structure of an upper portion of a first substrate used in a fourth modified example of the liquid crystal display device according to the first embodiment of the present invention. In this example, one depressed portion 58a is formed on a surface of a passivation film 58 made of an organic material above one set of the through-holes 28a and 32a. Also, one depressed portion 60a is formed on a surface of a passivation film 60 made of an inorganic material formed on the passivation film 58 made of the organic material above one set of the through-holes 28a and 32a.

Figure 9:
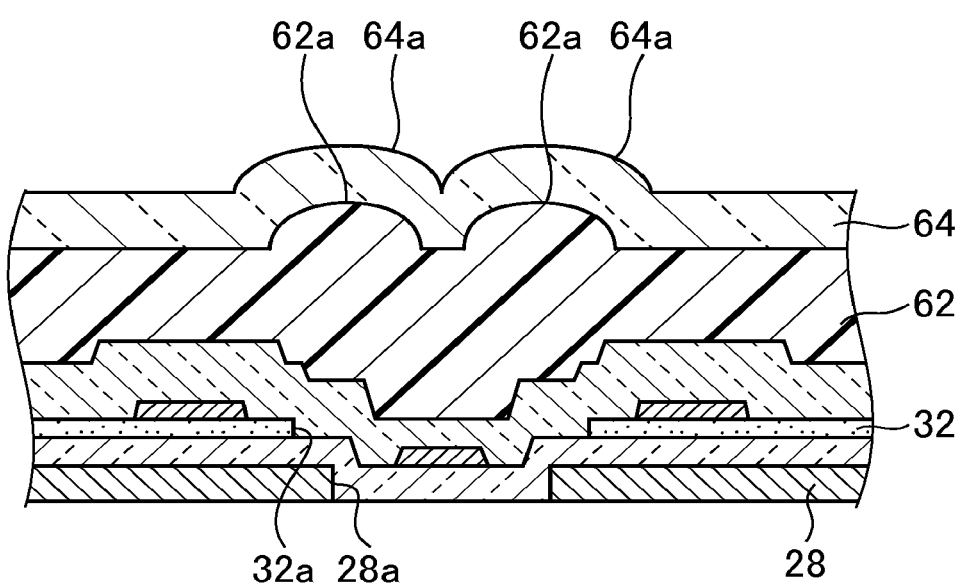
FIG. 9 is a diagram illustrating a structure of an upper portion of a first substrate used in a fifth modified example of the liquid crystal display device according to the first embodiment of the present invention.

FIG. 9 is a diagram illustrating a structure of an upper portion of a first substrate used in a fifth modified example of the liquid crystal display device according to the first embodiment of the present invention. In this example, a plurality of projecting portions 62a are formed on a surface of a passivation film 62 made of an organic material above one set of the through-holes 28a and 32a. Also, a plurality of projecting portions 64a are formed on a surface of a passivation film 64 made of an inorganic material formed on the passivation film 62 made of the organic material above one set of the through-holes 28a and 32a.

Figure 10:
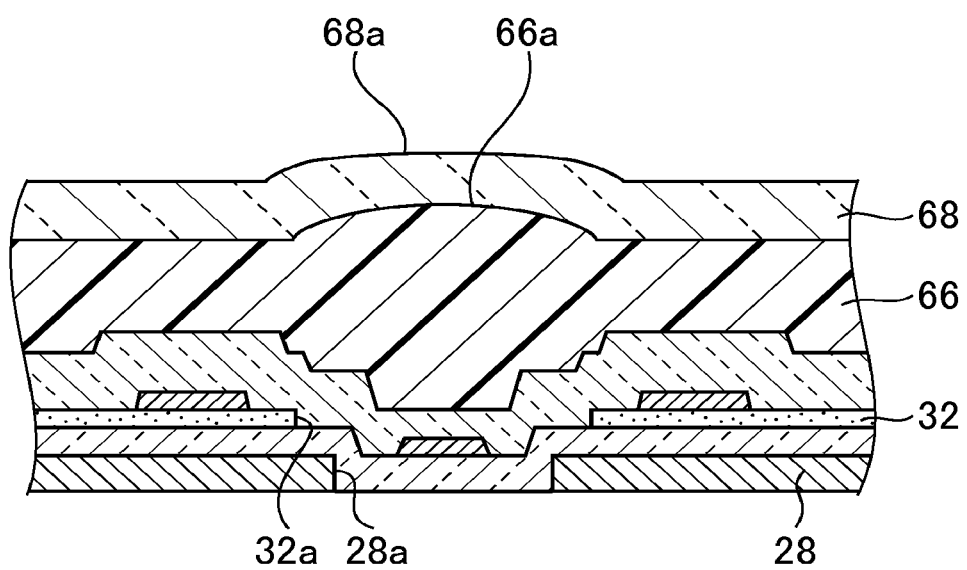
FIG. 10 is a diagram illustrating a structure of an upper portion of a first substrate used in a sixth modified example of the liquid crystal display device according to the first embodiment of the present invention.

FIG. 10 is a diagram illustrating a structure of an upper portion of a first substrate used in a sixth modified example of the liquid crystal display device according to the first embodiment of the present invention. In this example, one projecting portion 66a is formed on a surface of a passivation film 66 made of an organic material above one set of the through-holes 28a and 32a. Also, one projecting portion 68a is formed on a surface of a passivation film 68 made of an inorganic material formed on the passivation film 66 made of the organic material above one set of the through-holes 28a and 32a.

Figure 11:
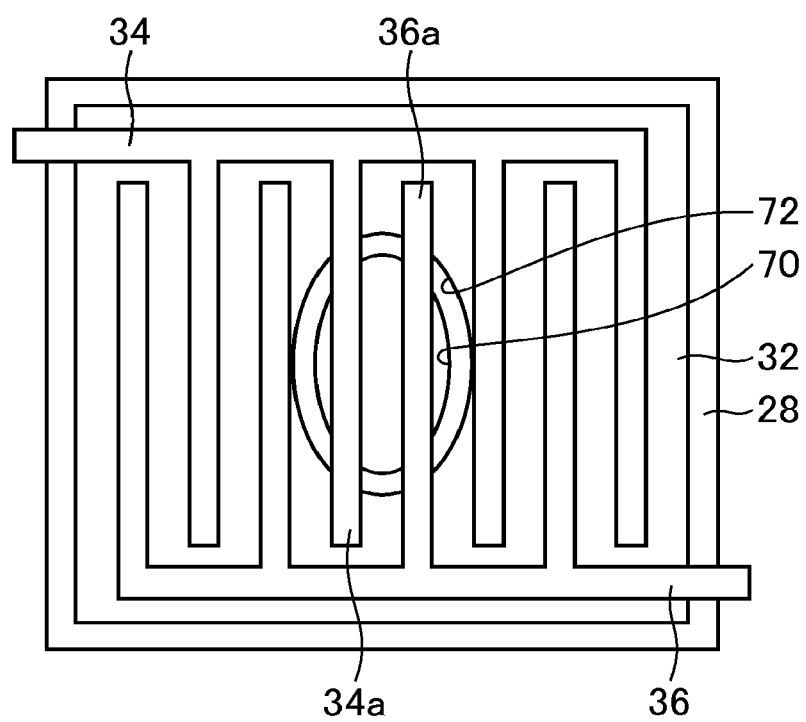
FIG. 11 is a diagram illustrating a thin film transistor used in a seventh modified example of the liquid crystal display device according to the first embodiment of the present invention.

FIG. 11 is a diagram illustrating a thin film transistor used in a seventh modified example of the liquid crystal display device according to the first embodiment of the present invention. In this example, a planar shape of through-holes 70 and 72 communicated with the gate electrode 28 and the semiconductor film 32 is oval. Both of a part (branched portion 34a) of the source electrode 34 and a part (branched portion 36a) of the drain electrode 36 pass through the insides of one through-hole 70 and one through-hole 72 which are communicated with each other, in a direction along a long axis of the through-holes 70 and 72.

Figure 12:
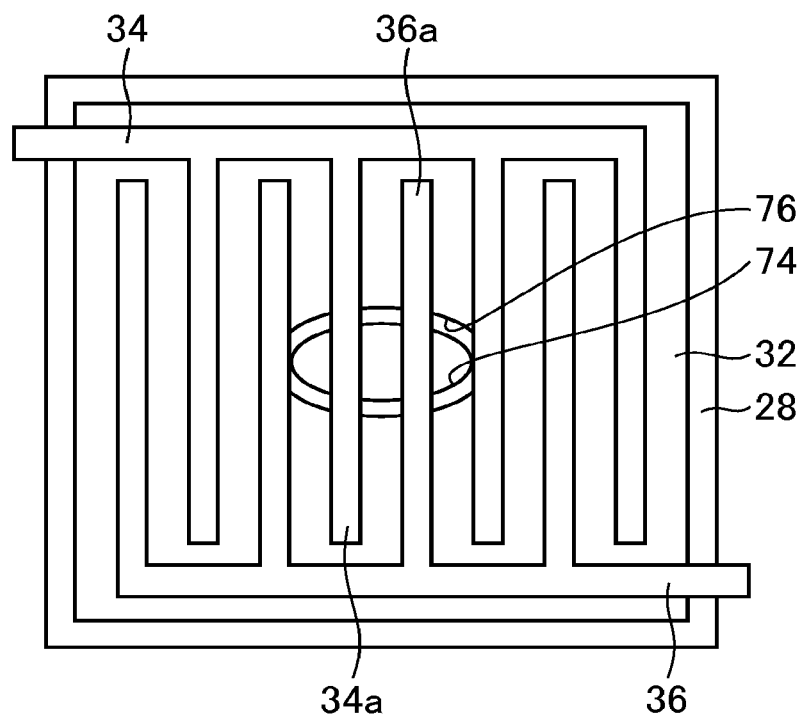
FIG. 12 is a diagram illustrating a thin film transistor used in an eighth modified example of the liquid crystal display device according to the first embodiment of the present invention.

FIG. 12 is a diagram illustrating a thin film transistor used in an eighth modified example of the liquid crystal display device according to the first embodiment of the present invention. In this example, a planar shape of through-holes 74 and 76 communicated with the gate electrode 28 and the semiconductor film 32 is oval. Both of a part (branched portion 34a) of the source electrode 34 and a part (branched portion 36a) of the drain electrode 36 pass through the insides of one through-hole 74 and one through-hole 76 which are communicated with each other, in a direction along a short axis of the through-holes 74 and 76.

Figure 13:
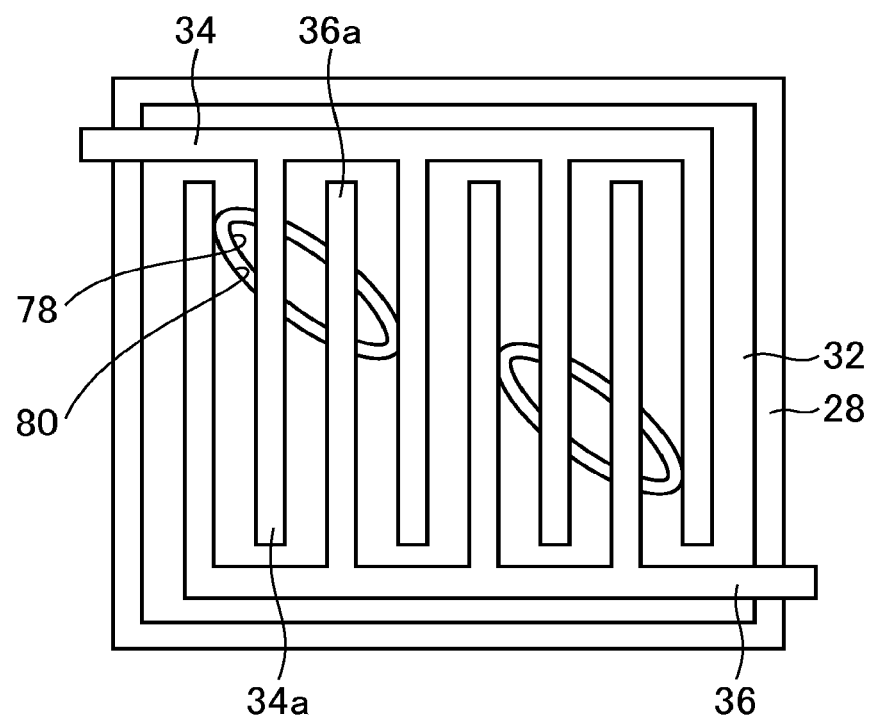
FIG. 13 is a diagram illustrating a thin film transistor used in a ninth modified example of the liquid crystal display device according to the first embodiment of the present invention.

FIG. 13 is a diagram illustrating a thin film transistor used in a ninth modified example of the liquid crystal display device according to the first embodiment of the present invention. In this example, a planar shape of through-holes 78 and 80 communicated with the gate electrode 28 and the semiconductor film 32 is oval. Both of a part (branched portion 34a) of the source electrode 34 and a part (branched portion 36a) of the drain electrode 36 pass through the insides of one through-hole 78 and one through-hole 80 which are communicated with each other, in an oblique direction (direction orthogonal to both of a long axis and a short axis of the through-holes 78 and 80).

Figure 14:
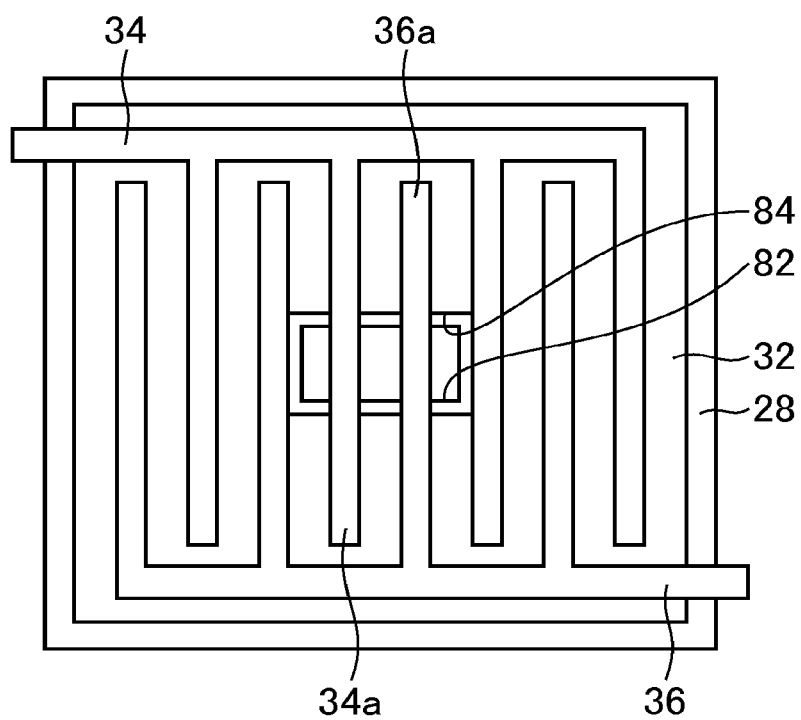
FIG. 14 is a diagram illustrating a thin film transistor used in a tenth modified example of the liquid crystal display device according to the first embodiment of the present invention.

FIG. 14 is a diagram illustrating a thin film transistor used in a tenth modified example of the liquid crystal display device according to the first embodiment of the present invention. In this example, a planar shape of through-holes 82 and 84 communicated with the gate electrode 28 and the semiconductor film 32 is rectangular (oblong). Both of a part (branched portion 34a) of the source electrode 34 and a part (branched portion 36a) of the drain electrode 36 pass through the insides of one through-hole 82 and one through-hole 84 which are communicated with each other, in a direction along a short side of a rectangle of the through-holes 82 and 84.

Figure 15:
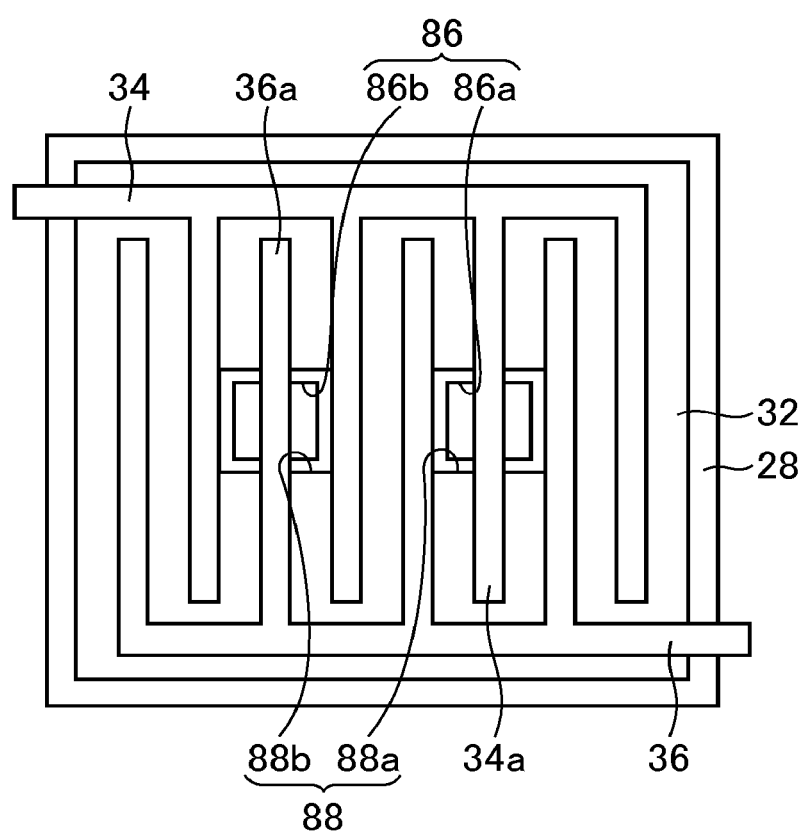
FIG. 15 is a diagram illustrating a thin film transistor used in an eleventh modified example of the liquid crystal display device according to the first embodiment of the present invention.

FIG. 15 is a diagram illustrating a thin film transistor used in an eleventh modified example of the liquid crystal display device according to the first embodiment of the present invention. In this example, a planar shape of through-holes 86 and 88 communicated with the gate electrode 28 and the semiconductor film 32 is rectangular (square). A part (branched portion 34a) of the source electrode 34 passes through the insides of one through-hole 86a and one through-hole 88a which are communicated with each other, in a direction along a side of a square of the through-holes 86a and 88a, but the drain electrode 36 does not pass therethrough. A part (branched portion 36a) of the drain electrode 36 passes through the insides of the other through-hole 86b and the other through-hole 88b which are communicated with each other, in a direction along a side of a square of the through-holes 86a and 88a, but the source electrode 34 does not pass therethrough.

Figure 16:
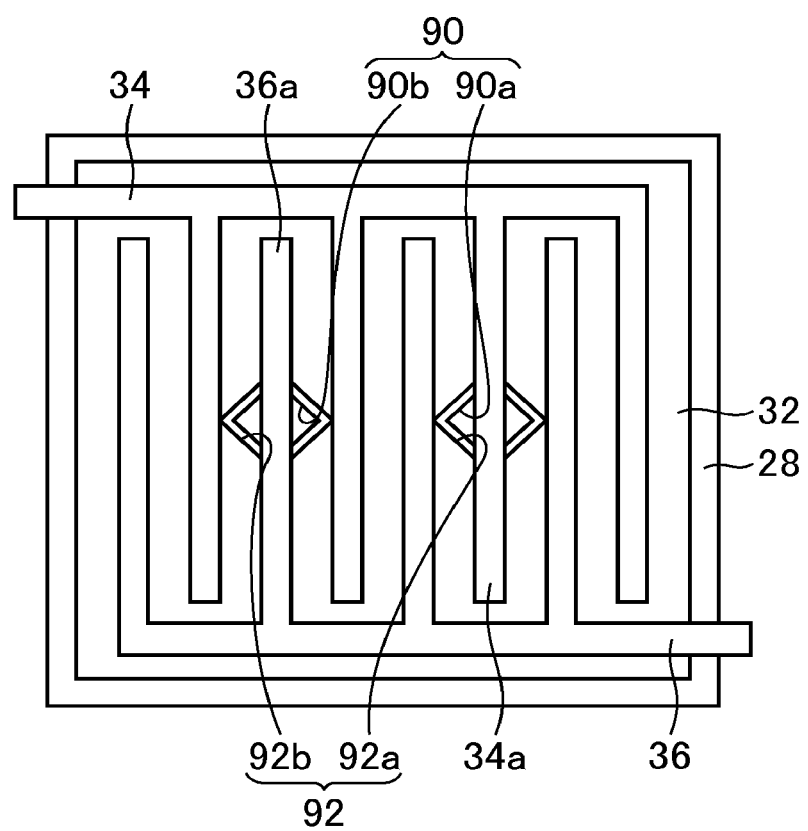
FIG. 16 is a diagram illustrating a thin film transistor used in a twelfth modified example of the liquid crystal display device according to the first embodiment of the present invention.

FIG. 16 is a diagram illustrating a thin film transistor used in a twelfth modified example of the liquid crystal display device according to the first embodiment of the present invention. In this example, a planar shape of through-holes 90 and 92 communicated with the gate electrode 28 and the semiconductor film 32 is rectangular (square or diamond shape). A part (branched portion 34a) of the source electrode 34 passes through the insides of one through-hole 90a and one through-hole 92a which are communicated with each other, in a direction along a diagonal line of the rectangle of the through-holes 90a and 92a, but the drain electrode 36 does not pass therethrough. A part (branched portion 36a) of the drain electrode 36 passes through the insides of the other through-hole 90b and the other through-hole 92b which are communicated with each other, in a direction along a diagonal line of the rectangle of the through-holes 90b and 92b, but the source electrode 34 does not pass therethrough.

Figure 17:
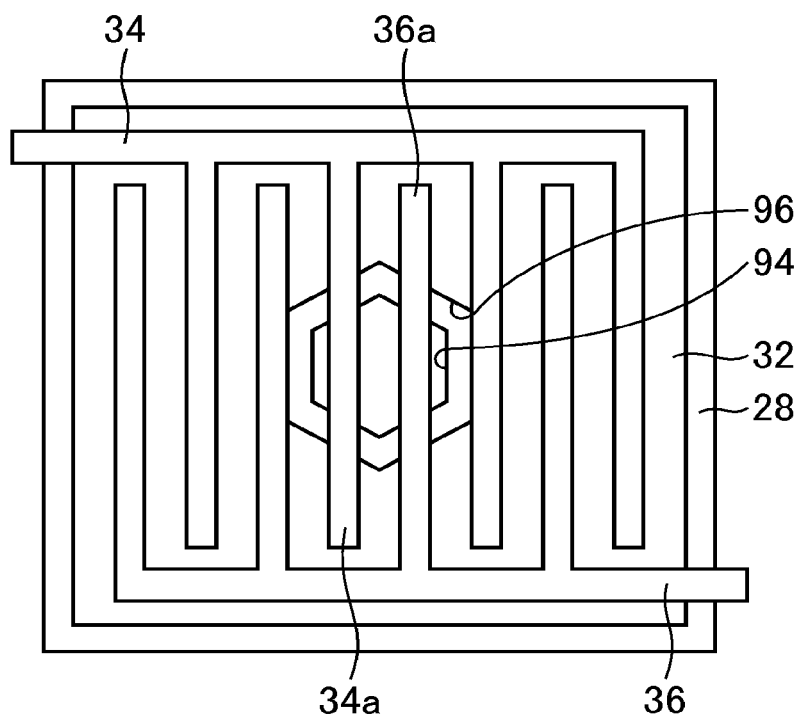
FIG. 17 is a diagram illustrating a thin film transistor used in a thirteenth modified example of the liquid crystal display device according to the first embodiment of the present invention.

FIG. 17 is a diagram illustrating a thin film transistor used in a thirteenth modified example of the liquid crystal display device according to the first embodiment of the present invention. In this example, a planar shape of through-holes 94 and 96 communicated with the gate electrode 28 and the semiconductor film 32 is polygonal (for example, hexagon). Both of a part (branched portion 34a) of the source electrode 34 and a part (branched portion 36a) of the drain electrode 36 pass through the insides of one through-hole 94 and one through-hole 96 which are communicated with each other, in a direction along any one side of the through-holes 94 and 96.

Figure 18:
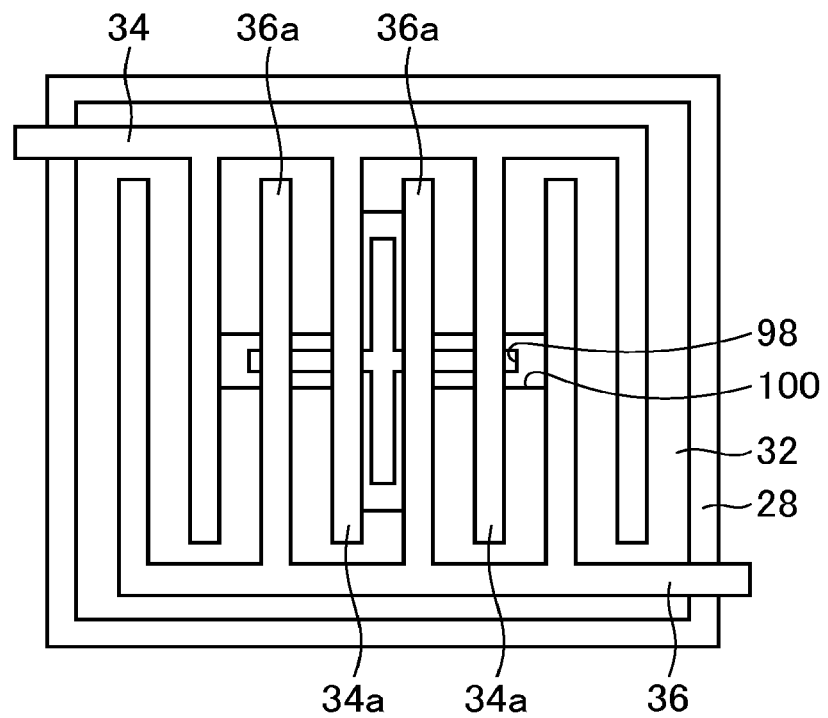
FIG. 18 is a diagram illustrating a thin film transistor used in a fourteenth modified example of the liquid crystal display device according to the first embodiment of the present invention.

FIG. 18 is a diagram illustrating a thin film transistor used in a fourteenth modified example of the liquid crystal display device according to the first embodiment of the present invention. In this example, a planar shape of through-holes 98 and 100 communicated with the gate electrode 28 and the semiconductor film 32 is cross. Both of a part (branched portion 34a) of the source electrode 34 and a part (branched portion 36a) of the drain electrode pass through the insides of one through-hole 98 and one through-hole 100 which are communicated with each other, in a direction along one of a longitudinal line and a lateral line drawing a cross of the through-holes 98 and 100.

Second Embodiment

Figure 19:
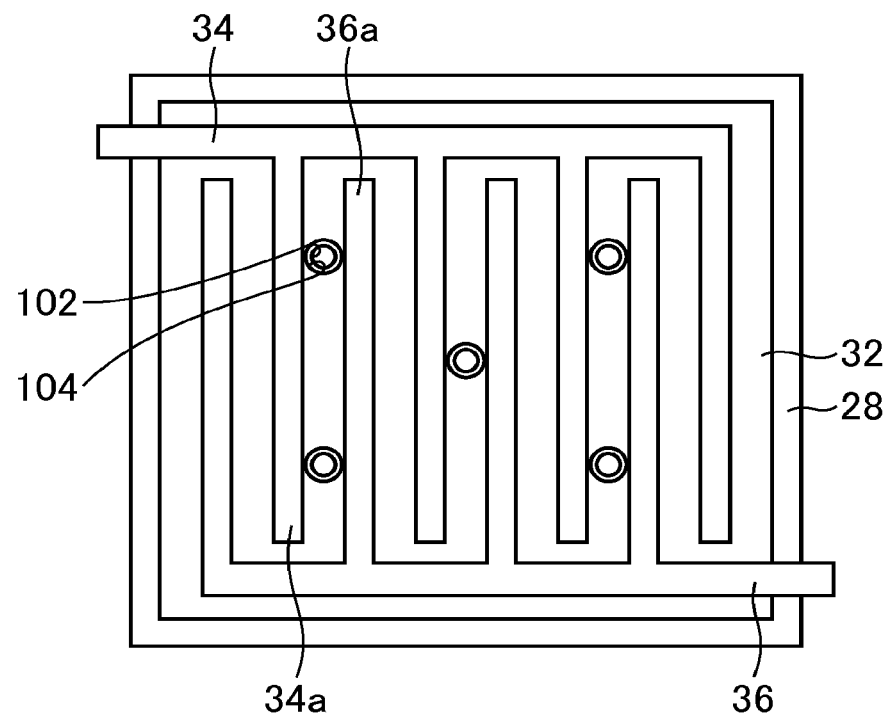
FIG. 19 is a diagram illustrating a thin film transistor used in a liquid crystal display device according to a second embodiment of the present invention.

FIG. 19 is a diagram illustrating a thin film transistor used in a liquid crystal display device according to a second embodiment of the present invention.

This embodiment is different from the first embodiment in that the source electrode 34 and the drain electrode 36 are formed with the avoidance of overlapping with through-holes 102 and 104 of the gate electrode 28 and the semiconductor film 32. The other structure and manufacturing method correspond to those described in the first embodiment. Similarly, in this embodiment, since a light can be applied from the first substrate 10 through through-holes 102 and 104, the same advantages as those in the first embodiment can be achieved.

Figure 20:
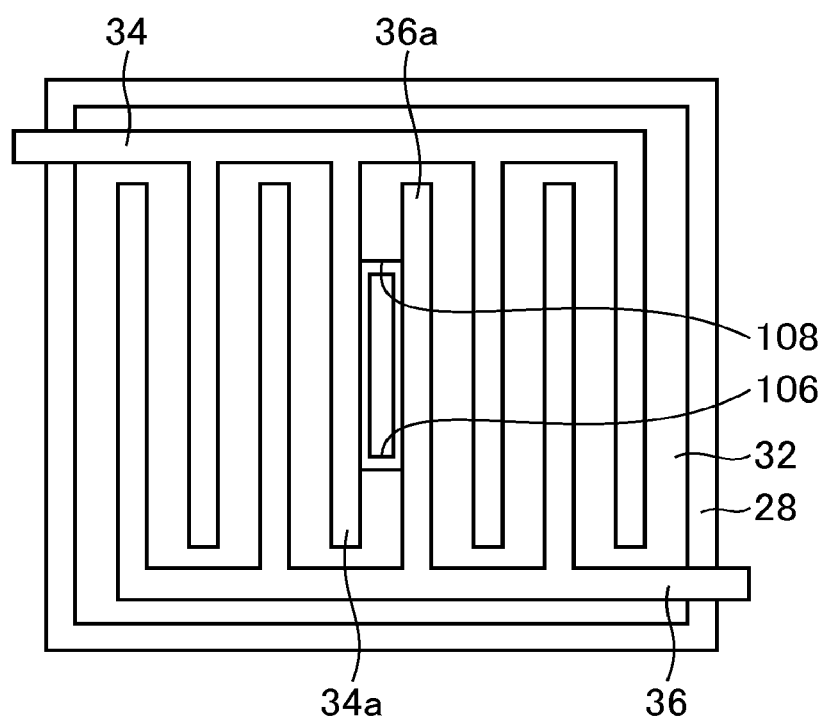
FIG. 20 is a diagram illustrating a thin film transistor used in a first modified example of the liquid crystal display device according to the second embodiment of the present invention.

FIG. 20 is a diagram illustrating a thin film transistor used in a first modified example of the liquid crystal display device according to the second embodiment of the present invention. A planar shape of the through-holes 102 and 104 illustrated in FIG. 19 is circular whereas a planar shape of through-holes 106 and 108 illustrated in FIG. 20 is rectangular (for example, oblong).

Figure 21:
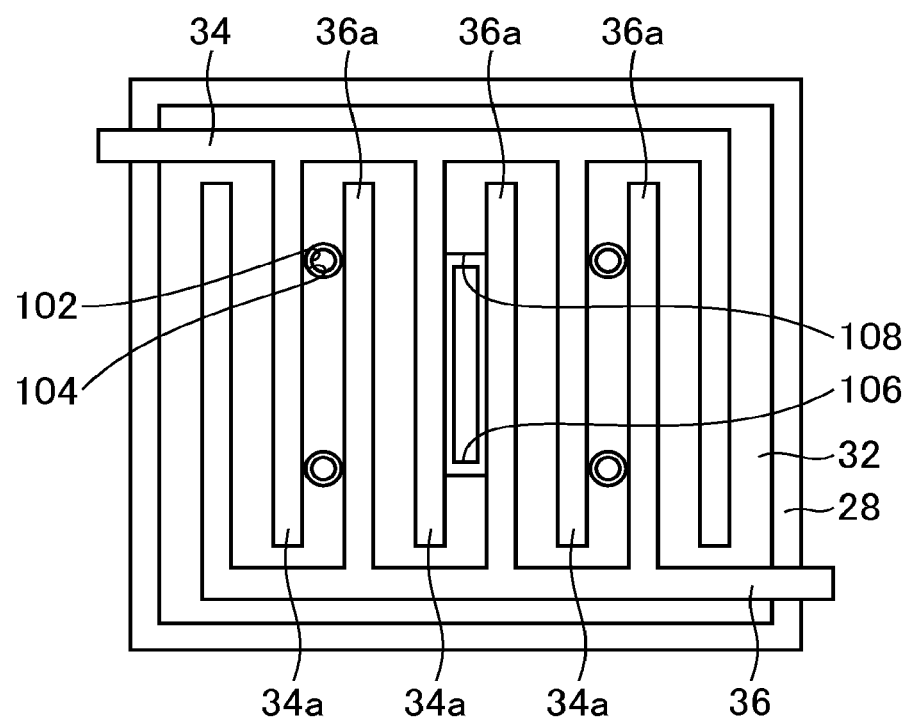
FIG. 21 is a diagram illustrating a thin film transistor used in a second modified example of the liquid crystal display device according to the second embodiment of the present invention.

FIG. 21 is a diagram illustrating a thin film transistor used in a second modified example of the liquid crystal display device according to the second embodiment of the present invention. In this example, the gate electrode 28 is formed with the through-holes 102 circular in a planar shape, and the through-hole 106 rectangular (for example, oblong) in a planar shape. The semiconductor film 32 is formed with the through-holes 104 circular in a planar shape, and the through-hole 108 rectangular (for example, oblong) in a planar shape. The circular through-holes 102 and 104 are communicated with each other, and the rectangular through-holes 106 and 108 are communicated with each other.

Figure 22:
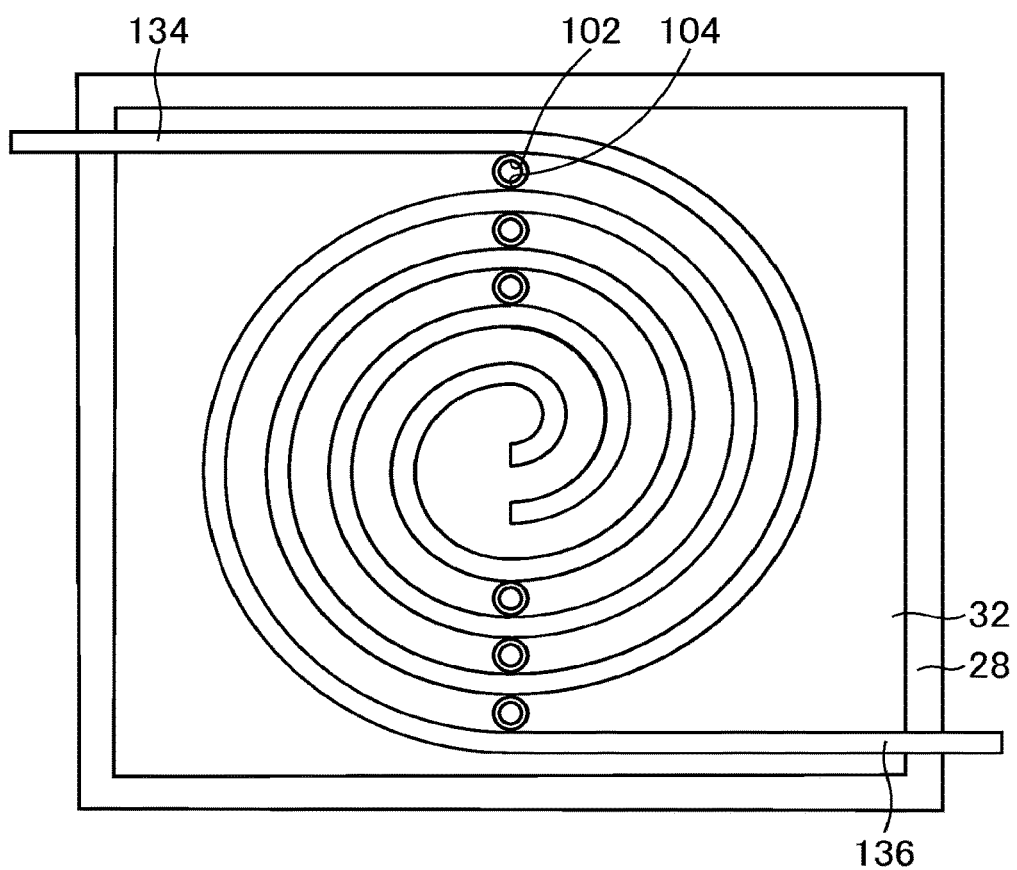
FIG. 22 is a diagram illustrating a thin film transistor used in a third modified example of the liquid crystal display device according to the second embodiment of the present invention.

FIG. 22 is a diagram illustrating a thin film transistor used in a third modified example of the liquid crystal display device according to the second embodiment of the present invention. In this example, a source electrode 134 and a drain electrode 136 are each extended in a spiral manner. Therefore, a channel area between the source electrode 134 and the drain electrode 136 is extended in a spiral manner, and a channel length is lengthened in a spiral manner. The through-holes 102 and 104 of the gate electrode 28 and the semiconductor film 32 are configured as described above.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a first substrate including a pixel area which displays an image, and a peripheral area which is disposed outside of the pixel area;
a driver circuit formed in the peripheral area of the first substrate;
a second substrate arranged to face the first substrate; and
a sealing material disposed to surround the pixel area in the peripheral area of the first substrate and bonding the first substrate and the second substrate together,
wherein the driver circuit has thin film transistors each of which includes a first electrode, a gate insulating film that covers the first electrode, a semiconductor film that overlaps with the first electrode through the gate insulating film, and a second electrode and a third electrode formed on the semiconductor film and spaced from each other,
wherein the first electrode has a first through-hole, and the semiconductor film has a second through-hole which overlaps with the first through-hole,
wherein a part of the sealing material overlaps with the first through-hole and the second through-hole, and
wherein neither the second electrode nor the third electrode overlaps with the first through-hole and the second through-hole.

2. The display device according to claim 1, further comprising: a passivation film having at least one layer that covers the second electrode and the third electrode.

3. The display device according to claim 2,
wherein the passivation film includes at least one depressed portion, and
wherein the depressed portion overlaps with the first through-hole and the second through-hole.

4. The display device according to claim 2,
wherein the passivation film includes at least one projecting portion, and the projecting portion overlaps with the first through-hole and the second through-hole.

5. The display device according to claim 1,
wherein the second through-hole is larger than the first through-hole.

6. The display device according to claim 1,
wherein the semiconductor film includes a portion configuring a channel area of each thin film transistor between the second electrode and the third electrode, and
wherein the second electrode and the third electrode are configured in meandering shapes.

7. The display device according to claim 1,
wherein each of the second electrode and the third electrode is formed into a pectinate shape having a plurality of branched portions, and
wherein one of the branched portions of the second electrode and one of the branched portions of the third electrode are alternately arranged.

* * * * *